United States Patent [19]
Sugayama et al.

[11] Patent Number: 4,740,723
[45] Date of Patent: Apr. 26, 1988

[54] SEMICONDUCTOR SWITCH

[75] Inventors: Shigeru Sugayama; Tatsuo Shimura, both of Hitachi; Tadaaki Kariya, Ibaraki; Sigeo Tomita, Hitachi, all of Japan

[73] Assignees: Hitachi, Ltd., Tokyo; Hitachi Haramachi Semi-Conductor, Ltd., Hitachi, both of Japan

[21] Appl. No.: 842,186

[22] Filed: Mar. 21, 1986

[30] Foreign Application Priority Data

Mar. 25, 1985 [JP] Japan .................................. 60-60401

[51] Int. Cl.$^4$ ............................................. H03K 17/72
[52] U.S. Cl. .................................... 307/633; 307/637; 307/646; 307/305; 361/93; 361/98
[58] Field of Search .......... 307/252 A, 252 C, 252 G, 307/252 T, 305; 323/274, 284; 361/93, 98

[56] References Cited

U.S. PATENT DOCUMENTS 3,263,128 7/1966 White .............................. 307/252 C

FOREIGN PATENT DOCUMENTS 320926 1/1972 U.S.S.R. ......................... 307/252 C

*Primary Examiner*—John Zazworsky
*Attorney, Agent, or Firm*—Antonelli, Terry & Wands

[57] ABSTRACT

A voltage across a resistor of a small value connected in series with the cathode or anode of a thyristor is used as a signal source for overcurrent detection. When an overcurrent is generated, the voltage across the resistor increases in excess of the built-in voltage between the base and emitter of a transistor, thereby turning on the transistor. A transistor to take out a current from the gate of the thyristor is turned on. Thus, the self-turn off operation of the thyristor is executed.

32 Claims, 2 Drawing Sheets

SEMICONDUCTOR SWITCH

BACKGROUND OF THE INVENTION

The present invention relates to a semiconductor switch and, more particularly, to a semiconductor switch suitable to provide an overcurrent protection.

Electronic apparatuses need to be protected from an overcurrent. Two examples of the conventional protection circuits for the overcurrent have been disclosed in, "Semiconductor Handbook", published by Ohm Co., Ltd. 1977, pages 696 to 697. According to the current limiter type protection circuit, which is one of those protection circuits disclosed in this publication, in the series type DC regulating power supply using a transistor for control, a resistor to detect a load current is connected in series to a load. When a voltage across this resistor which is developed due to the load current exceeds a base-emitter voltage $V_{BE}$ of an overcurrent detecting transistor whose base and emitter are connected across this resistor, the overcurrent detecting transistor is made conductive and a base current of the controlling transistor is bypassed through a collector of the overcurrent detecting transistor, so that an increase in load current is prevented. However, according to such a current limiter type protection system, an overload current of a predetermined level continues to flow as long as the overcurrent lasts, resulting in an increase in heat generation of the controlling transistor. Therefore, it is necessary to set a heat capacity of the controlling transistor to a sufficiently high value. Consequently, in the case where such a current limiter type protection system is applied to the semiconductor switch, there is the problem that a chip area of the semiconductor switch is enlarged. On the other hand, according to the current shut-off type protection system, which is the other protection circuit described in the foregoing "Semiconductor Handbook", the overcurrent flows through the controlling transistor only during the period from the occurrence of the overcurrent condition till the complete shut-off by the controlling transistor, which period is small as compared with that of the current limiter type protection system, removing the heat related problem. Nevertheless, it is still necessary to considerably enlarge the chip area of the semiconductor switch in proportion to the magnitude of the overcurrent. Further, according to the current shut-off type protection system, after the current was shut off, the circuit must be reset by the external control circuit, so that there is also a problem that this results in an increase in number of parts and causes the cost to be raised.

A technology relating to the present application has been disclosed in Japanese Patent Unexamined Publication No. 14355/84 laid open on Jan. 25, 1984. This publication discloses turning off a gate turn-off thyristor (GTO) by short-circuiting the gate with the cathode of the gate turn-off thyristor by means of a transistor. However, nothing is disclosed with respect to the protection of the thyristor when the overcurrent is generated.

When a thyristor is to be used as a semiconductor switch, if the turn-off is performed at a value below a surge current withstanding capacity of the thyristor or below an allowable current square time product ($I^2t$), the thyristor will not be broken and the switch circuit and the system controlled by the switch circuit can be easily protected. However, there is a limitation on a turn-off current value and a particularly large thermal capacity or tolerance is needed to permit a large turn-off current. Therefore, it has been necessary to enlarge the chip sizes for the thyristor and short-circuiting transistor. In this connection, the turn-off current is defined as a current flowing through a thyristor at which current the thyristor can be safely turned off without being damaged.

In addition, an external circuit has been also necessary to detect the overcurrent and to supply a signal to turn off the thyristor.

SUMMARY OF THE INVENTION

It is an object of the present invention to provide a semiconductor switch which has an overcurrent detecting function and can completely perform the self-shut off when an overcurrent is detected.

Another object of the invention is to provide a semiconductor switch which can perform the self-shut off when an overcurrent is detected and also perform the self-reset when the overcurrent is eliminated.

Still another object of the invention is to provide a semiconductor switch which is suitable to be formed on an IC and in which the number of component elements is small and a chip area occupied by the semiconductor switch is small.

According to one aspect of the present invention, to solve the foregoing problems, the invention uses the voltage across a resistor of a small resistance connected in series with the cathode or anode of the thyristor and the resistance of this resistor is set such that the voltage across the resistor becomes above the built-in voltage between the base and emitter of a transistor connected to the resistor when an overcurrent is generated. By this transistor being turned off, a transistor to take out a current from the gate of the thyristor is turned on, thereby causing the self-turn off operation of the thyristor.

DESCRIPTION OF THE PREFERRED EMBODIMENTS

Figure 1:
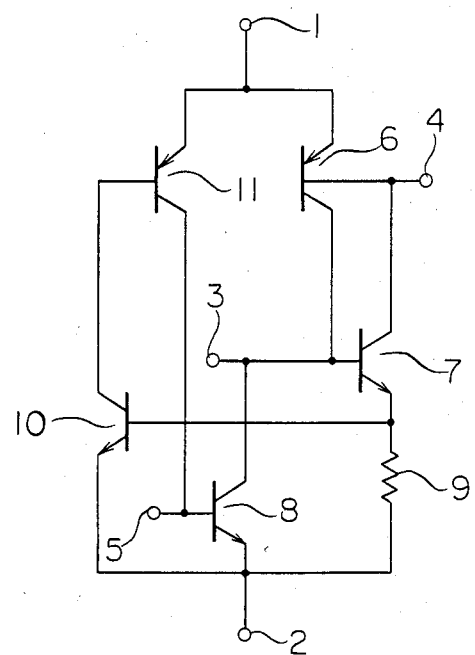
FIG. 1 is a circuit diagram showing an embodiment of the present invention.

An embodiment of the present invention will now be described hereinbelow with reference to FIG. 1.

An emitter of a pnp transistor 6 serves as an anode terminal 1 and its base serves as an n gate terminal 4. A base of an npn transistor 7 serves as a p gate terminal 3. The base and collector of the pnp transistor 6 are connected to the collector and base of the npn transistor 7, respectively. Both transistors 6 and 7 constitute a thyristor having p and n gates.

One end of a resistor 9 to detect a current of the thyristor composed of the transistors 6 and 7 and a base of an npn transistor 10 are connected to an emitter of the npn transistor 7. A collector, which is one of the main electrodes of the npn transistor 10 is connected to a base of a pnp transistor 11 whose emitter is connected to a anode terminal 1 of the thyristor. A collector of the pnp transistor 11 is connected to a base of an npn transistor 8 whose collector, which is one of the main electrodes is connected to the base of the npn transistor 7. An OFF terminal 5 of the thyristor is provided for the base of the npn transistor 8.

Emitters, which are the other main electrodes of the npn transistors 10 and 8 are connected to the other end of the resistor 9. A cathode terminal 2 is provided at the connecting point of the emitters of the npn transistors 10 and 8.

As will be understood from the above description, the npn transistor 8 is connected to the gate of the thyristor and constitutes means for turning off the thyristor or short-circuiting means between the gate and cathode of the thyristor. On the other hand, the transistor 10 whose base and emitter are connected to both ends of the current detecting resistor 9 and the transistor 11 together constitute means for amplifying a voltage signal which is developed across the resistor 9 due to a current flowing therethrough.

The thyristor composed of the pnp transistor 6 and npn transistor 7 can be turned on by taking out the base current of the transistor 6 from the n gate terminal 4 or by supplying the base current of the transistor 7 from the p gate terminal 3. On the contrary, for the turn-off of the thyristor, an external signal is supplied to the OFF terminal 5 and the npn transistor 8 is turned on, so that the npn transistor 7 is turned off and the thyristor is turned off.

A load current $I_K$ flows through the resistor 9 in a normal ON state of the thyristor. However, assuming that a built-in voltage between the base and emitter of the npn transistor 10 (i.e., base-emitter voltage) is $V_{BE(10)}$ and a resistance value of the resistor 9 is $R_K$, the npn transistor 10 is not turned on under the condition of $$I_K \times R_K < V_{BE(10)} \tag{1}$$

Thus, the thyristor is held in the ON state. However, when the current $I_K$ increases, namely, an overcurrent flows and the condition of $$I_K \times R_K \geq V_{BE(10)} \tag{2}$$

is satisfied, the npn transistor 10 is turned on since the base current flows therethrough. Thus, the pnp transistor 11 is also turned on and the collector current flows into the base of the transistor 8 as the base current thereof, thereby short-circuiting the p gate terminal 3 of the thyristor with the cathode terminal 2. Thus, the thyristor is promptly turned off in the manner mentioned above.

In the case where the thyristor is made on by supplying the gate current to the p gate terminal 3, i.e., the base current to the transistor 7, when an overcurrent is generated, satisfying the condition of expression (2), the thyristor is turned off as mentioned above, and the current $I_K$ of the resistor 9 becomes zero, causing the base bias of the npn transistor 10 to stop flowing. However, the thyristor is held in the OFF state at least for the storage times of the npn transistor 10, pnp transistor 11, and npn transistor 8.

The thyristor is again turned on when the npn transistor 8 is turned off after an expiration of the storage times. At this time, if the condition of expression (2) is still satisfied by the current flowing through the resistor 9 i.e., when the overcurrent is still flowing, the turn-off operation of the thyristor is repeated. On the contrary, under the condition which satisfies expression (1), namely, when no overcurrent flows, the thyristor is held in the ON state.

In the case where the thyristor is made on by supplying one shot gate current, i.e., the base current to the transistor 7 is removed from the p gate terminal 3 once the thyristor has been turned on, the thyristor continues to be held in the OFF state after detecting the occurrence of the overcurrent.

According to the embodiment of the present invention, the current value at which the thyristor performs the self-shut off operation as mentioned above can be set by the resistance value of the resistor 9 to thereby cause the self-shut off of the thyristor at a predetermined fixed current value. Further, when the abnormal current ceases to flow and the overcurrent state is not present thereafter, namely, when the accident is removed and a normal state is restored, the self-shut off operation of the thyristor stops and the thyristor is made on by supplying a gate current, so that there is the effect such that the circuit recovery operation of the system can be easily performed.

Figure 2:
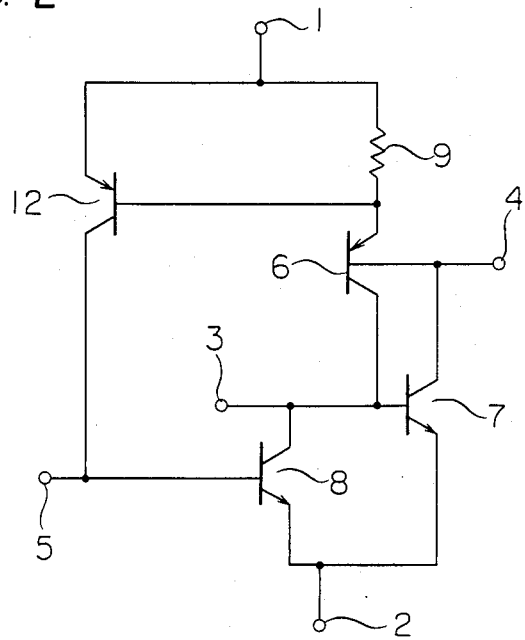
FIG. 2 is a circuit diagram showing another embodiment of the invention.

FIG. 2 is a circuit diagram showing another embodiment of the present invention, in which the same parts and components at those shown in the embodiment of FIG. 1 are designated by the same reference numerals and their descriptions are omitted.

This embodiment is different from the case of FIG. 1 in that the current detecting resistor 9 is connected to the anode side of the thyristor. Namely, the resistor 9 is connected between the emitter of the transistor 6 and the anode terminal 1. With this arrangement, the amplifying means composed of the transistors 10 and 11 in FIG. 1 is further simplified and is constituted by a single transistor 12. An emitter of the transistor 12 is connected to the end on the side of the anode terminal 1 of the resistor 9 and its base is connected to the end of the emitter side of the transistor 6 of the resistor 9. A collector of the transistor 12 is connected to the base of the transistor 8. The emitter of the transistor 7 is directly connected to the cathode terminal 2. The other constitution is similar to that in FIG. 1.

In operation, when an overcurrent is generated and the voltage drop in the resistor 9 increases in excess of the built-in voltage $V_{BE}$ of the base and emitter of the transistor 12, the transistor 12 is turned on and, a current is supplied through the collector and emitter of the transistor 12 to the base of the transistor 8, so as to turn on the transistor 8 which in turn takes out the base current of the transistor 7, whereby the thyristor is turned off.

An advantage of this embodiment is that the number of parts used is smaller than that in the first embodiment.

Although the first and second embodiments relate to a unidirectional, i.e., DC switch, the third and fourth embodiments, which will be explained hereinbelow, relate to a bidirectional, namely, AC switch.

Figure 3:
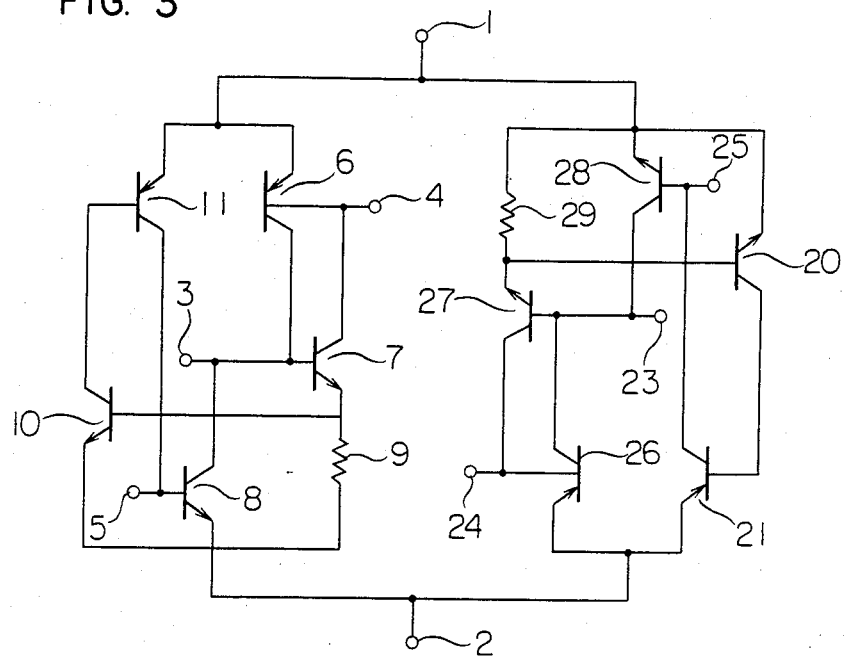
FIG. 3 is a circuit diagram showing still another embodiment of the invention.

FIG. 3 is a circuit diagram showing the third embodiment of the invention. In this embodiment, two semiconductor switches in the embodiment shown in FIG. 1 are connected in anti-parallel with each other, thereby constituting an AC switch which also detects overcurrents which are generated for both positive and negative periods of the AC power source and performs the self-shut off. In FIG. 3, the left switch circuit is the same as that of the embodiment of FIG. 1. The right switch circuit is also substantially the same as that of the left switch circuit excluding that the cathode side end of the right circuit is connected to the anode terminal 1 and its anode side end is connected to the cathode terminal 2. An npn transistor 20 corresponds to the npn transistor 10. A pnp transistor 21 corresponds to the pnp transistor 11. A pnp transistor 26 corresponds to the pnp transistor 6. An npn transistor 27 corresponds to the npn transistor 8. An npn transistor 28 corresponds to the npn transistor 8. A resistor 29 corresponds to the resistor 9. Terminals 23, 24, and 25 correspond to the terminals 3, 4, and 5, respectively. These elements are connected in the same manner as the left circuit and its description is omitted. This embodiment has the effect such that the AC electric power can be controlled without deteriorating the overcurrent protecting capability.

Figure 4:
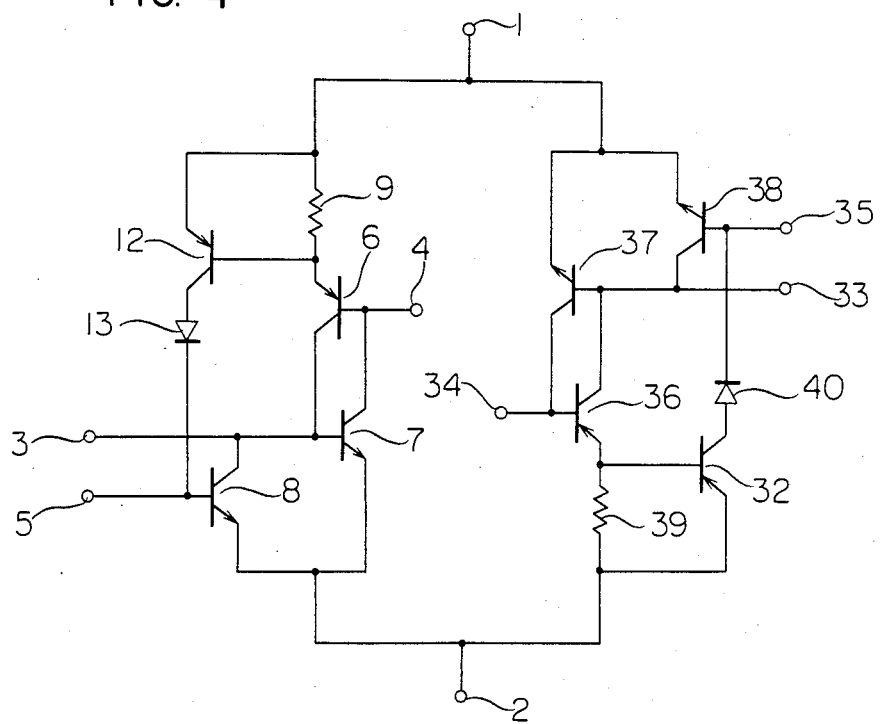
FIG. 4 is a circuit diagram showing still another embodiment of the invention.

FIG. 4 is a circuit diagram showing the fourth embodiment of the invention. In this embodiment, two semiconductor switches in the embodiment of FIG. 2 are connected in anti-parallel with each other, thereby constituting an AC switch. In FIG. 4, the left switch circuit is substantially the same as that in the embodiment of FIG. 2 excluding that a diode 13 is connected between the collector of the current detecting transistor 12 and the base of the transistor 8. The diode 13 is added to the collector of the current detecting pnp transistor 12, thereby improving the reverse blocking voltage of the transistor 12. The right switch circuit is also substantially the same as the left one excluding that the cathode side end of the left circuit is connected to the anode terminal 1 and its anode side end is connected to the cathode terminal 2. A pnp transistor 32 corresponds to the pnp transistor 12. A pnp transistor 36 corresponds to the pnp transistor 6. An npn transistor 37 corresponds to the npn transistor 7. An npn transistor 38 corresponds to the npn transistor 8. A diode 40 corresponds to the diode 13. A resistor 39 corresponds to the resistor 9. Terminals 33, 34, and 35 correspond to the terminals 3, 4, and 5, respectively. These elements are connected in the same manner as those in the left switch circuit and its description is omitted. This embodiment also has the effect such that the AC electric power can be controlled without deteriorating the overcurrent protecting capability.

According to the invention, the circuit can be automatically shut off for an overcurrent in a period of time as short as about the switching time of the transistor without damaging the thyristor which constitutes the switch circuit. In addition, since a current value at which the thyristor performs self shut-off can be arbitrarily set, the turn-off current of the thyristor can be reduced to a current normally flowing through the thyristor and a semiconductor switch the rated current of which is substantially equal to the current normally flowing through the switch can be used, and therefore, the chip size can be minimized without considering the overcurrent which is generated when an accident occurs.

We claim:

1. A semiconductor switch comprising:
    a thyristor;
    means, connected in series with said thyristor, for detecting a current flowing through the thyristor;
    amplifying means, connected to receive a voltage, as a supply voltage to said amplifying means, which is generated across a series connection of said thyristor and said current detecting means due to the current flowing through the thyristor, for amplifying a first output signal from said detecting means and generating a second output signal; and
    short-circuiting means, connected between a gate and a cathode of said thyristor, for short-circuiting said gate and cathode in response to said second output signal reaching a predetermined level indicative of a predetermined level of current flowing through the thyristor,
    wherein said short-circuiting means includes a first transistor whose main electrodes are connected between the gate and cathode of said thyristor, and a base of said first transistor receives said second output signal.

2. A semiconductor switch according to claim 1 wherein the base of said first transistor further receives an externally applied input control signal to turn off said thyristor.

3. A semiconductor switch according to claim 1, wherein said amplifying means includes a second transistor whose base and emitter are respectively connected to both ends of said resistor and whose collector is electrically connected to the base of said first transistor.

4. A semiconductor switch comprising:
    first and second terminal means to be connected in series with a current path whose make and break are to be controlled;
    a thyristor having a gate to be supplied with an input signal to control said thyristor, an anode electrically connected to said first terminal means, and a cathode electrically connected to said second terminal means;
    first means, connected in series with said thyristor, for outputting a first electrical signal representative of a current flowing through said thyristor;
    second means, connected to the gate of said thyristor, for turning off the thyristor in response to a second electrical signal to said second means; and
    third means, connected to receive said first electrical signal, for detecting that said current reaches a predetermined value on the basis of said first electrical signal and generating a third electrical signal as said second signal,
    wherein said first means includes a resistor connected in series with said thyristor either between said anode and said first terminal means or between said cathode and said second terminal means and outputs a voltage, as said first signal, which is generated across said resistor due to said current,
    wherein said third means includes a first transistor whose base and emitter are respectively connected to both ends of said resistor, and
    wherein said second means includes a second transistor whose main electrodes are connected between the gate and cathode of said thyristor, and a base of said second transistor is electrically connected to a collector of said first transistor.

5. A semiconductor switch according to claim 4, wherein a value $R_K$ of said resistor is set on the basis of an expression $$R_K = V_{BE}/I_K$$

where, $V_{BE}$ denotes a base-emitter voltage of said first transistor and $I_K$ represents said predetermined value of said current.

6. A semiconductor switch according to claim 4, wherein said resistor is connected between said cathode and said second terminal means,
- a collector of said second transistor is connected to said gate and its emitter is connected to said second terminal means, respectively,
- said third means includes a third transistor whose emitter is connected to said first terminal means and whose base and collector are respectively connected to the collector of said first transistor and the base of said second transistor, and
- the base of said first transistor is connected to said cathode side end of said resistor and the emitter of said first transistor is connected to said second terminal side of said resistor, respectively.

7. A semiconductor switch according to claim 4, wherein said resistor is connected between said anode and said first terminal means,
- a collector of said second transistor is connected to said gate and its emitter is connected to said second terminal means, respectively, and
- an emitter of said first transistor is connected to the end on said first terminal means side of said resistor and its base is connected to the end on said anode side of said resistor, respectively.

8. A semiconductor switch according to claim 4, wherein said thyristor includes at least one pnp transistor and npn transistor, an emitter of said pnp transistor constitutes said anode and its base and collector are respectively connected to collector and base of said npn transistor, and an emitter of said npn transistor constitutes said cathode and its base constitutes said gate, respectively.

9. A bidirectional semiconductor switch comprising:
(A) first and second terminal means which are connected in series with a current path whose make and break are to be controlled; and
(B) two unidirectional semiconductor switch means connected in anti-parallel with each other between said first and second terminal means, each of said two switch means including
  (a) third and fourth terminals,
  (b) a thyristor having a gate which is supplied with an input signal to control said thyristor, an anode electrically connected to said third terminal, and a cathode electrically connected to said fourth terminal,
  (c) first means, connected in series with said thyristor, for outputting a first electrical signal representative of a current flowing through said thyristor,
  (d) second means, connected to the gate of said thyristor, for turning off the thyristor in response to a second electrical signal to said second means, and
  (e) third means, connected to receive said first electrical signal, for detecting that said current reaches a predetermined value on the basis of said first electrical signal and generating a third electrical signal as said second signal,
wherein the third and fourth terminals of one of said two switch means are respectively connected to said first and second terminal means, and the third and fourth terminals of the other switch means are respectively connected to said second and first terminal means.

10. A bidirectional semiconductor switch according to claim 9, wherein said detecting means includes a resistor connected in series with said thyristor either between said anode and said third terminal means or between said cathode and said fourth terminal means and outputs a voltage, as said first signal, which is generated across said resistor due to said current.

11. A bidirectional semiconductor switch according to claim 10, wherein said second means includes a first transistor whose main electrodes are connected between the gate and cathode of said thyristor, and the base of said first transistor receives said third signal.

12. A birdirectional semiconductor switch according to claim 11, wherein the base of said first transistor further receives the input control signal from an outside to turn off the thyristor.

13. A bidirectional semiconductor switch according to claim 10, wherein said third means includes a first transistor whose base and emitter are respectively connected to both ends of said resistor,
- said second means includes a second transistor whose main electrodes are connected between the gate and cathode of said thyristor, and a base of said second transistor is electrically connected to a collector of said first transistor.

14. A bidirectional semiconductor switch according to claim 13, wherein a value $R_K$ of said resistor is set on the basis of an expression $$R_K = V_{BE}/I_K$$

where, $V_{BE}$ denotes a base-emitter voltage of said first transistor and $I_K$ represents said predetermined value of said current.

15. A bidirectional semiconductor switch according to claim 13, wherein said resistor is connected between said cathode and said fourth terminal means,
- a collector of said second transistor is connected to said gate and its emitter is connected to said fourth terminal means, respectively,
- said third means includes a third transistor whose emitter is connected to said third terminal means and whose base and collector are respectively connected to the collector of said first transistor and the base of said second transistor, and
- the base of said first transistor is connected to an end on said cathode side of said resistor and the emitter of said first transistor is connected to said second terminal side of said resistor, respectively.

16. A bidirectional semiconductor switch according to claim 13, wherein said resistor is connected between said anode and said third terminal means,
- a collector of said second transistor is connected to said gate and an emitter of said second transistor is connected to said fourth terminal means, respectively, and
- an emitter of said first transistor is connected to an end on said third terminal means side of said resistor and a base of said first transistor is connected to an end on said anode side of said resistor and an collector of said first transistor is connected to a base of said second transistor through a diode, respectively.

17. A bidirectional semiconductor switch according to claim 9, wherein said thyristor includes at least one pnp transistor and one npn transistor, an emitter of said pnp transistor constitutes said anode and its base and collector are respectively connected to collector and base of said npn transistor, and an emitter of said npn transistor constitutes said cathode and a base of said npn transistor constitutes said gate, respectively.

18. A semiconductor switch comprising:
a thyristor;
means, connected in series with said thyristor, for detecting a current flowing through the thyristor;
amplifying means, connected to receive a voltage, as a supply voltage to said amplifying means, which is generated across a series connection of said thyristor and said current detecting means due to the current flowing through the thyristor, for amplifying a first output signal from said detecting means and generating a second output signal; and
short-circuiting means, connected between a gate and a cathode of said thyristor, for short-circuiting said gate and cathode in response to said second output signal
wherein said short-circuiting means includes a first transistor whose main electrodes are connected between the gate and cathode of said thyristor, and a base of said first transistor receives said second output signal.

19. A semiconductor switch according to claim 18, wherein said current detecting means includes a resistor connected in series with said thyristor at either one of the anode and cathode sides of the thyristor.

20. A semiconductor switch according to claim 18, wherein the base of said first transistor further receives an externally applied input control signal to turn off said thyristor.

21. A semiconductor switch according to claim 18, wherein said amplifying means includes a second transistor whose base and emitter are respectively connected to both ends of said resistor and whose collector is electrically connected to the base of said first transistor.

22. A semiconductor switch comprising:
first and second terminal means to be connected in series with a current path whose make and break are to be controlled;
a thyristor having a gate to be supplied with an input signal to control said thyristor, an anode electrically connected to said first terminal means, and a cathode electrically connected to said second terminal means;
first means, connected in series with said thyristor, for outputting a first electrical signal representative of a current flowing through said thyristor;
second means, connected to the gate of said thyristor, for turning off the thyristor in response to a second electrical signal to said second means; and
third means, connected to receive said first electrical signal, for detecting that said current reaches a predetermined value on the basis of said first electrical signal and generating a third electrical signal as said second signal,
wherein said first means includes a resistor connected in series with said thyristor either between said anode and said first terminal means or between said cathode and said second terminal means and outputs a voltage, as said first signal, which is generated across said resistor due to said current, and
wherein said second means includes a first transistor whose main electrodes are connected between the gate and cathode of said thyristor, and a base of said first transistor receives said third signal.

23. A semiconductor switch according to claim 22, wherein the base of said first transistor further receives an input control signal to turn off said thyristor.

24. A semiconductor switch according to claim 22, wherein said thyristor includes at least one pnp transistor and one npn transistor, an emitter of said pnp transistor constitutes said anode and its base and collector are respectively connected to collector and base of said npn transistor, and an emitter of said npn transistor constitutes said cathode and its base constitutes said gate, respectively.

25. A semiconductor switch comprising:
first and second terminal means to be connected in series with a current path whose make and break are to be controlled;
a thyristor having a gate to be supplied with an input signal to control said thyristor, an anode electrically connected to said first terminal means, and a cathode electrically connected to said second terminal means;
first means, connected in series with said thyristor, for outputting a first electrical signal representative of a current flowing through said thyristor;
second means, connected to the gate of said thyristor, for turning off the thyristor in response to a second electrical signal to said second means; and
third means, operated on a voltage developed across said first and second terminal means and connected to receive said first electrical signal, for detecting that said current reaches a predetermined value on the basis of said first electrical signal and generating a third electrical signal as said second signal,
wherein said first means includes a resistor connected in series with said thyristor either between said cathode and said first terminal means or between said cathode and said second terminal means and outputs a voltage, as said first signal, which is generated across said resistor due to said current, and
wherein said second means includes a first transistor whose main electrodes are connected between the gate and cathode of said thyristor, and a base of said first transistor receives said third signal.

26. A semiconductor switch according to claim 25, wherein the base of said first transistor further receives an input control signal to turn off said thyristor.

27. A semiconductor switch comprising:
first and second terminal means to be connected in series with a current path whose make and break are to be controlled;
a thyristor having a gate to be supplied with an input signal to control said thyristor, an anode electrically connected to said first terminal means, and a cathode electrically connected to said second terminal means;
first means, connected in series with said thyristor, for outputting a first electrical signal representative of a current flowing through said thyristor;
second means, connected to the gate of said thyristor, for turning off the thyristor in response to a second electrical signal to said second means; and
third means, operated on a voltage developed across said first and second terminal means and connected to receive said first electrical signal, for detecting that said current reaches a predetermined value on the basis of said first electrical signal and generating a third electrical signal as said second signal.
wherein said first means includes a resistor connected in series with said thyristor either between said cathode and said first terminal means or between said cathode and said second terminal means and outputs a voltage, as said first signal, which is generated across said resistor due to said current, wherein said third means includes a first transistor whose base and emitter are respectively connected to both ends of said resistor, and wherein said second means includes a second transistor whose main electrodes are connected between the gate and cathode of said thyristor, and a base of said second transistor is electrically connected to a collector of said first transistor.

28. A semiconductor switch according to claim 27, wherein a value $R_K$ of said resistor is set on the basis of an expression $$R_K = V_{BE}/I_K$$

where, $V_{BE}$ denotes a base-emitter voltage of said first transistor and $I_K$ represents said predetermined value of said current.

29. A semiconductor switch according to claim 27, wherein said resistor is connected between said cathode and said second terminal means,
- a collector of said second transistor is connected to said gate and its emitter is connected to said second terminal means, respectively,
- said third means includes a third transistor whose emitter is connected to said first terminal means and whose base and collector are respectively connected to the collector of said first transistor and the base of said second transistor, and
- the base of said first transistor is connected to said cathode side end of said resistor and the emitter of said first transistor is connected to said second terminal side of said resistor, respectively.

30. A semiconductor switch according to claim 27, wherein said resistor is connected between said anode and said first terminal means,
- a collector of said second transistor is connected to said gate and its emitter is connected to said second terminal means, respectively, and
- an emitter of said first transistor is connected to the end on said first terminal means side of said resistor and its base is connected to the end on said anode side of said resistor, respectively.

31. A semiconductor switch comprising:

first and second terminal means to be connected in series with a current path whose make and break are to be controlled;

a thyristor having a gate to be supplied with an input signal to control said thyristor, an anode electrically connected to said first terminal means, and a cathode electrically connected to said second terminal means;

first means, connected in series with said thyristor, for outputting a first electrical signal representative of a current flowing through said thyristor;

second means, connected to the gate of said thyristor, for turning off the thyristor in response to a second electrical signal to said second means; and third means, operated on a voltage developed across said first and second terminal means and connected to receive said first electrical signal, for detecting that said current reaches a predetermined value on the basis of said first electrical signal and generating a third electrical signal as said second signal, wherein said second means includes a first transistor whose main electrodes are connected between the gate and cathode of said thyristor, and a base of said first transistor receives said third signal.

32. A semiconductor switch according to claim 31, wherein the base of said first transistor further receives an input control signal to turn off said thyristor.

* * * * *